United States Patent [19]
Dentai et al.

[11] Patent Number: 4,787,086
[45] Date of Patent: Nov. 22, 1988

[54] HIGH-POWER, FUNDAMENTAL TRANSVERSE MODE LASER

[75] Inventors: Andrew G. Dentai, Atlantic Highlands; Gadi Eisenstein, Middletown; Enrique A. J. Marcatili, Rumson; Rodney S. Tucker, Howell, all of N.J.

[73] Assignee: American Telephone and Telegraph Company, AT&T Bell Laboratories, Murray Hill, N.J.

[21] Appl. No.: 142,266

[22] Filed: Jan. 11, 1988

Related U.S. Application Data

[63] Continuation of Ser. No. 864,770, May 19, 1986.

[51] Int. Cl.$^4$ .............................................. H01S 3/098
[52] U.S. Cl. ............................... 372/19; 372/92; 372/44; 372/6; 372/99
[58] Field of Search .............. 372/6, 18, 19, 49, 45, 372/99, 92; 350/96.15, 96.17, 96.18

[56] References Cited

U.S. PATENT DOCUMENTS

| | | | |
|---|---|---|---|
| 3,803,511 | 4/1974 | Thompson | 331/94.5 |
| 3,824,493 | 7/1974 | Hakki | 331/94.5 H |
| 3,877,052 | 4/1975 | Dixon et al. | 350/96.15 |
| 3,883,821 | 5/1975 | Miller | 331/94.5 H |
| 3,897,135 | 7/1975 | Dyott | 350/96 C |
| 4,143,940 | 3/1979 | Khoe | 350/96.15 |
| 4,358,851 | 11/1982 | Scifers et al. | 372/6 |
| 4,427,261 | 1/1984 | Khoe et al. | 350/96.20 |
| 4,464,759 | 8/1984 | Haus et al. | 372/18 |
| 4,479,224 | 10/1984 | Rediker | 372/44 |
| 4,605,942 | 8/1986 | Camlibel et al. | 373/45 |
| 4,608,697 | 8/1986 | Coldren | 372/19 |

OTHER PUBLICATIONS

Burrus et al., "Nd:Ya 6 Single Crystal Fiber Laser: Room Temp. cw Operation Using a Single LED as an End Crystal"; Appl. Phys. Lett. 29(1), p. 37, Jul. '76.

"A Continuous Laser with a Lightguide Resonator" A. M. Zabelin et al., *Vestnik Moskovskogo Universiteta. Fizika*, vol. 35, No. 6; 1980, pp. 23-27.

"Active Mode-Locking Characteristics of InGaAsP-Single Mode Fiber Composite Cavity Lasers", G. Eisenstein et al., *IEEE Journal of Quantum Electronics*, vol. QE-22, Nol. 1, Jan. 1986, pp. 142-148.

*Primary Examiner*—Léon Scott, Jr.
*Attorney, Agent, or Firm*—Gregory C. Ranieri

[57] ABSTRACT

High-power, single transverse mode laser operation is achieved in an extended-cavity structure by combining a semiconductor gain medium having a large optical cavity together with a length of single mode optical fiber between first and second reflector surfaces. The first reflector surface is formed on an end facet of the semiconductor gain medium; the second reflector surface is formed on an end of the optical fiber. Output power is efficiently coupled from the fiber end of the extended-cavity laser to a standard transmission medium.

6 Claims, 1 Drawing Sheet

HIGH-POWER, FUNDAMENTAL TRANSVERSE MODE LASER

This application is a continuation of application Ser. No. 864,770, filed May 19, 1986.

TECHNICAL FIELD

This invention relates to semiconductor lasers and, more particularly, to arrangements for achieving fundamental transverse mode operation at high power.

BACKGROUND OF THE INVENTION

Single transverse mode light sources are important in communication system applications. By providing a fundamental or zero-order transverse mode optical signal, the light source is more efficiently coupled to the optical transmission medium and to other optical system components. In laser machining and micrographics system applications, a fundamental transverse mode light source exhibits an energy distribution in which the energy is concentrated along the optic axis of the laser resonator.

Heterostructure semiconductor lasers have been used for obtaining fundamental transverse and longitudinal mode optical signals. In heterostructure semiconductor lasers, transverse mode control is usually achieved by narrowing the active region of the laser through the use of growth techniques or etching and regrowth techniques or special laser geometries. While the active region may be narrowed to achieve fundamental transverse mode operation for the laser, the volume of the pumped optical cavity is similarly reduced causing a corresponding reduction of the available optical output power from the laser.

In U.S. Pat. No. 3,790,902, a semiconductor heterostructure gain medium has been coupled to a passive dielectric waveguide to form a monolithic laser structure. This structure produces a single transverse mode optical output signal provided that the cross-section of the guiding portion in the passive dielectric waveguide is congruent with the cross-section of the active region in the gain medium, both cross-sections being measured perpendicular to the optic axis of the laser. Additional constraints are placed on the length of the dielectric waveguide, the refractive indices of the dielectric waveguide, and the refractive index difference between the active region and the dielectric waveguide. In addition to these design constraints, the laser does not afford ready coupling to transmission media such as optical fibers. Moreover, fabrication of the laser involves complicated processing steps to produce an aligned, monolithic device.

SUMMARY OF THE INVENTION

High-power, single transverse mode laser operation is achieved, in accordance with the principles of the present invention, in an extended-cavity structure by combining a semiconductor gain medium having a large optical cavity together with a length of single-mode optical fiber between first and second reflector surfaces. The first reflector surface is formed on an end surface of the semiconductor gain medium; the second reflector surface is formed on an end of the optical fiber. The first and second reflector surfaces form a single resonant optical cavity therebetween. Output power is efficiently coupled from the fiber end of the laser to a standard fiber transmission medium.

In one embodiment of the invention, the first reflector surface exhibits high reflectivity greater than 90% whereas the second reflector surface has moderate reflectivity (50–70%). A multilayer dielectric stack is employed to form both reflector surfaces.

BRIEF DESCRIPTION OF THE DRAWING

A more complete understanding of the invention may be obtained by reading the following description of a specific illustrative embodiment of the invention in conjunction with the appended drawing in which.

DETAILED DESCRIPTION

Figure 1:
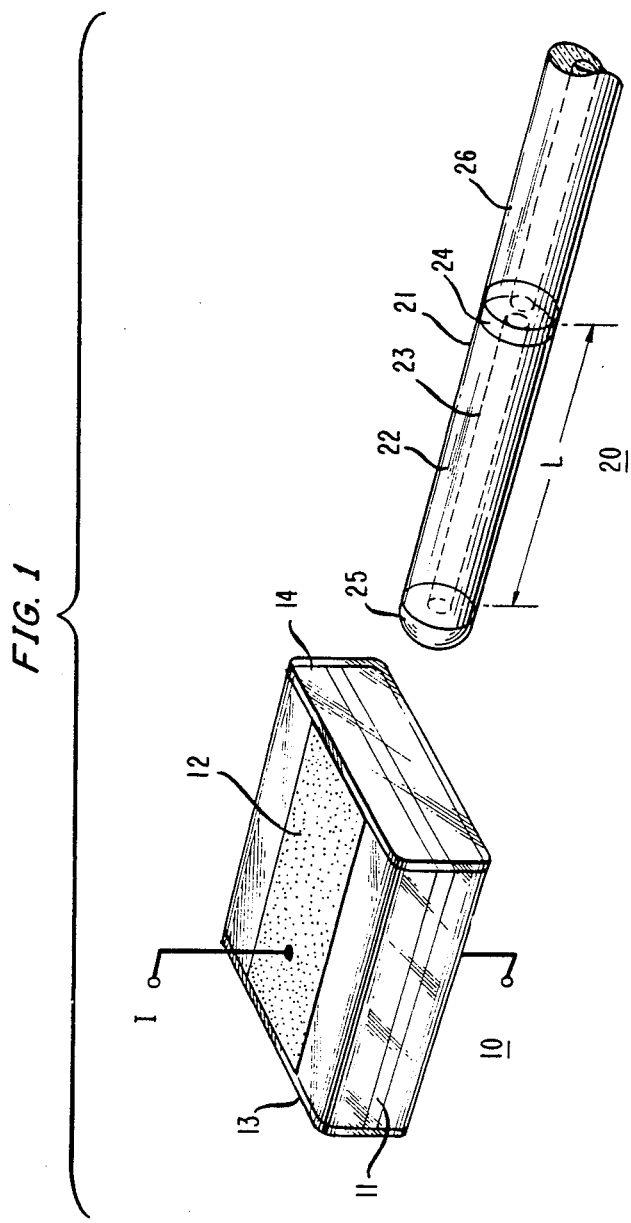
FIG. 1 is a view of the extended-cavity, high-power, fundamental transverse mode laser in accordance with the principles of the invention.

FIG. 1 is a simplified view (not to scale) of an embodiment of a high-power, single transverse mode, extended-cavity laser in accordance with the principles of the invention. The laser includes a semiconductor gain medium 10 and optical fiber cavity 20. In the embodiment shown in FIG. 1 and described below, semiconductor gain medium 10 is a gain guided structure.

Semiconductor heterostructure gain medium 10 is preferably fabricated as a high-power (large volume) semiconductor laser such as a high-power planar buried heterostructure laser or the like with or without a distributed feedback grating. Usually such lasers exhibit multitransverse mode behavior. In order to fabricate the gain medium 10 from a semiconductor laser, it is necessary to significantly reduce the reflectivity of at least one mirror surface of the laser so that the device is no longer capable of oscillating. To this end, surface 14 is made sufficiently transmissive to eliminate the oscillating capability of the semiconductor gain medium, whereas surface 13 of semiconductor gain medium 10 is made highly reflective (>90%) by cleaving, coating, deposition or other suitable techniques. It is preferred to reduce the reflectivity of surface 14 to less than 0.1%. In experimental practice, anti-reflection coatings have been applied to surface 14 to reduce the reflectivity to 0.02%. See G. Eisenstein et al., *Applied Optics*, Vol. 23, No. 1, pp. 161–4 (1984).

Top and bottom surfaces of gain medium 10 provide for making electrical contact to a current source I. For gain guided structures, stripe contact 12 primarily defines the lateral dimension of the optical cavity for gain medium 10. The optical cavity includes the volume of semiconductor material in active layer 11 substantially beneath stripe contact 12. As the volume of the optical cavity is increased, a corresponding increase in available optical power is experienced.

Intracavity mode control is provided generally by the elements of optical fiber cavity 20. Optical fiber cavity 20 includes a length L of single-mode optical fiber 21, coupling element 25, and reflector 24. Optical fiber 21 is a single-mode optical fiber, well known in the art, which is comprised of cladding 22 surrounding core 23. Coupling element 25 focuses the optical signals emitted from gain medium 10 into the core 23 of optical fiber 21. The coupling element shown in FIG. 1 is an integrated lens such as a spherical lens. Although coupling element 25 is shown integrated with optical fiber 21, it may be advantageous in certain instances to have coupling element 25 separated from optical fiber 21. Examples of the latter type of coupling element are standard convex lens arrangements, graded index of refraction arrangements, such as GRINRODs, and the like. While it is not essential to the practice of the invention, it may be desirable to deposit an anti-reflection coating on at least that portion of the coupling element facing surface 14 of the gain medium 10.

Reflector 24 serves as the output mirror for the extended cavity laser. The reflectivity of reflector 24 is chosen to be less than 100% to permit optical signals to be output from the laser. An exemplary embodiment for reflector 24 is as a multilayer dielectric stack deposited on a substantially flat end face of fiber 21 perpendicular to core 23. A fiber pigtail and connector may be mounted on the laser by butt coupling to reflector 24 as depicted by fiber 26.

The length L of optical fiber cavity 20 is preferably chosen to satisfy the relationship:

$$L \gtrsim \frac{2d^2 n_c}{\lambda}$$

where d is the smallest half-width of the optical beam as it emerges from the gain medium, $\lambda$ is the free space operating wavelength of the laser, and $n_c$ is the index of refraction of the core 23 in the passive optical fiber cavity 20. For the example described herein, L has been chosen to be 5.0 cm.

The extended cavity laser attains an optimum balance between low threshold current and high differential quantum efficiency when the reflectivities of reflector 24 and surface 13 are properly chosen. Reflectivities on the order of approximately 60% and 100%, respectively, are one possible pair for attaining an optimum balance.

In operation, the extended cavity laser provides transverse mode stabilization over a wide range of operating currents. Only the undamental transverse mode from gain medium 10 couples efficiently to the optical fiber cavity 20. Therefore, when the extended-cavity laser oscillates, the fundamental transverse mode is selected in preference to all other modes. The extended-cavity laser described above and embodied using a buried heterostructure gain medium (InGaAsP/InP) has been operated at a wavelength of 1.3 $\mu$m and at a threshold current of approximately 65 mA. The laser achieved a differential quantum efficiency of 23% with the maximum power delivered to the fiber 26 as 30 mW at $I = I_{DC} = 260$ mA.

It is to be understood that the abovedescribed arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, an index-guided semiconductor structure having a large optical cavity could be employed as the semiconductor gain medium.

What is claimed is:

1. An optical source comprising
   first and second reflectors separated from and opposite to each other for forming a single resonant optical cavity,
   a semiconductor gain medium having a major surface including a stripe contact extending longitudinally and transversely along said major surface for defining a large optical cavity in a volume of said gain medium thereunder, said semiconductor gain medium for generating a high-power optical signal by spontaneous emission,
   a single-mode optical fiber coupled to said semiconductor gain medium responsive to said high-power optical signal for causing a fundamental transverse mode optical signal to be amplified by said gain medium,
   said semiconductor gain medium and said single-mode optical fiber being disposed within said single resonant optical cavity formed by said reflectors, said optical source for producing stimulated coherent radiation in a fundamental transverse mode.

2. The optical source defined in claim 1 wherein the first reflector is disposed on a first surface of the semiconductor gain medium and said first reflector has reflectivity greater than 90%.

3. The optical source defined in claim 2 wherein the second reflector is disposed on an end of the single mode optical fiber and said second reflector has reflectivity in the range from 50% to 70%.

4. The optical source defined in claim 3 wherein the second reflector is comprised of a plurality of dielectric layers.

5. The optical source defined in claim 2 wherein an anti-reflection coating is disposed on a second surface of said semiconductor gain medium to provide a reflectivity less than 0.1% for said second surface, said second surface being opposite said first surface.

6. The optical source defined in claim 1 further comprised of means for coupling optical signals from said semiconductor gain medium to said single mode optical fiber and vice versa.

* * * * *